(12) United States Patent
Lee et al.

(10) Patent No.: US 9,221,072 B2
(45) Date of Patent: Dec. 29, 2015

(54) MASK FOR DEPOSITION AND DEPOSITION APPARATUS INCLUDING THE SAME

(71) Applicant: SAMSUNG DISPLAY CO., LTD., Yongin-si, Gyeonggi-do (KR)

(72) Inventors: Jungmin Lee, Yongin-si (KR); ChoongHo Lee, Yongin-si (KR)

(73) Assignee: Samsung Dislay Co., Ltd., Yongin-si (KR)

( * ) Notice: Subject to any disclaimer, the term of this patent is extended or adjusted under 35 U.S.C. 154(b) by 232 days.

(21) Appl. No.: 13/735,995

(22) Filed: Jan. 7, 2013

(65) Prior Publication Data

US 2013/0186330 A1 Jul. 25, 2013

(30) Foreign Application Priority Data

Jan. 19, 2012 (KR) .................. 10-2012-0006349

(51) Int. Cl.
  *B05C 21/00* (2006.01)
  *H01L 21/02* (2006.01)
  *C23C 14/04* (2006.01)

(52) U.S. Cl.
  CPC ............. *B05C 21/005* (2013.01); *C23C 14/042* (2013.01); *H01L 21/02636* (2013.01)

(58) Field of Classification Search
  None
  See application file for complete search history.

(56) References Cited

U.S. PATENT DOCUMENTS

2001/0036691 A1 11/2001 Kitazume et al.
2002/0059903 A1* 5/2002 Hasegawa et al. ............ 118/504
2003/0201711 A1* 10/2003 Abiko ........................... 313/504
2008/0100204 A1 5/2008 Kim
2011/0165327 A1 7/2011 Park et al.

FOREIGN PATENT DOCUMENTS

| JP | 10-298738 | 11/1998 |
|----|-----------|---------|
| JP | 2001-313169 | 11/2001 |
| JP | 2002-220656 | 8/2002 |
| JP | 2007-234345 | 9/2007 |
| JP | 2008-111183 | 5/2008 |
| JP | 2010-174305 | 8/2010 |
| KR | 10-2006-0033113 | 4/2006 |
| KR | 10-2006-0109627 | 10/2006 |
| KR | 10-2009-0090545 | 8/2009 |
| KR | 10-2010-0132430 | 12/2010 |
| KR | 10-2011-0082418 | 7/2011 |

* cited by examiner

*Primary Examiner* — Dah-Wei D Yuan
*Assistant Examiner* — Jethro M Pence
(74) *Attorney, Agent, or Firm* — Christie, Parker & Hale, LLP

(57) ABSTRACT

A mask for deposition includes a deposition material passing portion including at least one opening column having a plurality of openings arranged in a first direction, and a frame portion adjacent the deposition material passing portion, wherein each of the openings is defined by a first slope and a second slope facing each other along the first direction and inclining toward one side of the frame portion respectively, and a third slope and a fourth slope facing each other along a second direction crossing the first direction, and wherein an inclined angle of the first slope of one of the openings at a central area of one of the opening columns is different from an inclined angle of the first slope of an other one of the openings at an outer area of the opening column.

19 Claims, 7 Drawing Sheets

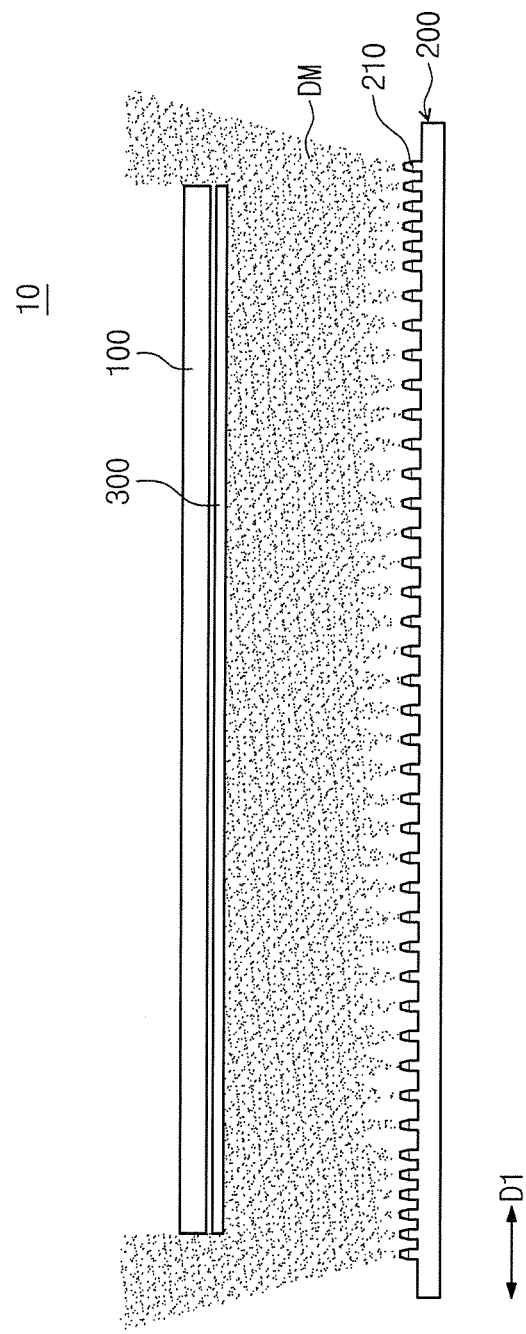

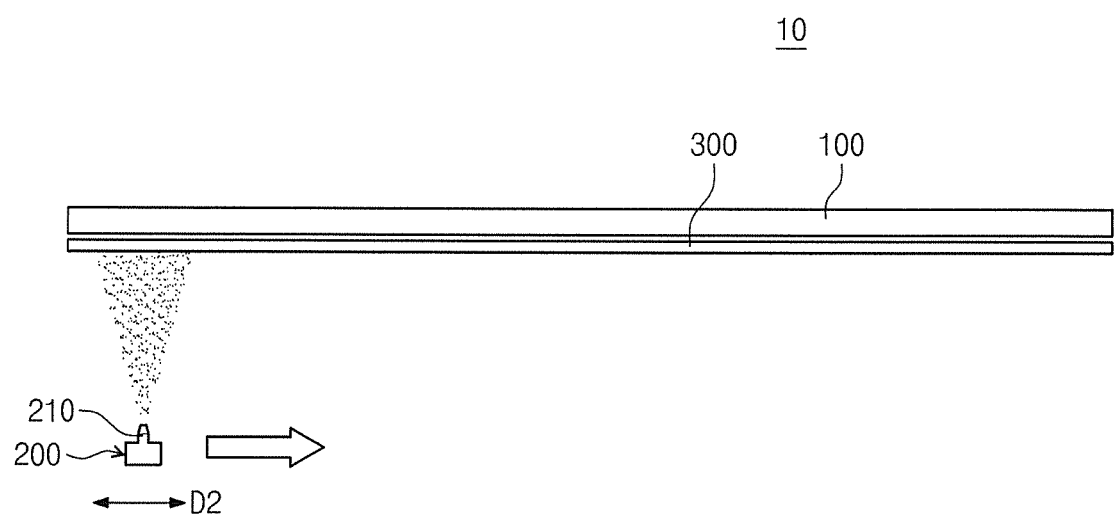

MASK FOR DEPOSITION AND DEPOSITION APPARATUS INCLUDING THE SAME

CROSS-REFERENCE TO RELATED APPLICATIONS

This application claims priority to and the benefit of Korean Patent Application No. 10-2012-0006349, filed on Jan. 19, 2012, in the Korean Intellectual Property Office, the entire contents of which are hereby incorporated by reference.

BACKGROUND

1. Field

Embodiments of the present invention relate to a mask for deposition and a deposition apparatus including the same.

2. Description of Related Art

A flat panel display or a semiconductor device is manufactured by depositing various materials on a substrate. A deposition process is performed using a mask for deposition. Materials deposited on the substrate form a thin film pattern.

Recently, in response to a high integration of semiconductor devices and a high resolution of flat panel display, density of the thin film pattern is being increased.

SUMMARY

To improve performance of semiconductor devices and flat panel display, uniformity of the thin film pattern is desired.

Embodiments of the present invention include a mask for deposition. The mask may include a deposition material passing portion including at least one opening column having a plurality of openings arranged in a first direction, and a frame portion adjacent the deposition material passing portion, wherein each of the openings is defined by a first slope and a second slope facing each other along the first direction and inclining toward one side of the frame portion respectively, and a third slope and a fourth slope facing each other along a second direction crossing the first direction, and wherein an inclined angle of the first slope of one of the openings at a central area of one of the opening columns is different from an inclined angle of the first slope of an other one of the openings at an outer area of the opening column.

The outer area may include a first outer area and a second outer area, and the central area may be between the first and second outer areas.

The first slope of each of ones of the openings at the first and second outer areas may be closer to the central area than the second slope thereof.

Inclined angles of the first slopes of the ones of the openings at the first and second outer areas may be smaller than inclined angles of the second slopes of the ones of the openings at the first and second outer areas.

The inclined angles of the first slopes of the ones of the openings at the first and second outer areas that are closer to the central area may be greater than the inclined angles of the first slopes of others of the ones of the openings at the first and second outer areas that are farther from the central area.

The inclined angles of the second slopes of the ones of the openings at the first and second outer areas that are closer to the central area may be smaller than the inclined angles of the second slopes of the others of the ones of the openings at the first and second outer areas that are farther from the central area.

An inclined angle of the second slope of one of the openings at the central area may be substantially the same as an inclined angle of the first slope of the one of the openings at the central area.

The third and fourth slopes of each of the openings may incline toward one side of the frame portion.

An inclined angle of the third slope may be the same as an inclined angle of the fourth slope.

Embodiments of the present invention also provide a deposition apparatus. The deposition apparatus may include a source portion including a plurality of nozzles arranged in a first direction and configured to provide a deposition material to a substrate, and a mask for deposition between the substrate and the source portion, the mask for deposition including a deposition material passing portion including at least one opening column having a plurality of openings arranged in the first direction, and a frame portion adjacent to the deposition material passing portion, wherein the openings are defined by first and second slopes facing each other in the first direction and inclined to one side of the frame portion, and by third and fourth slopes facing each other in a second direction, and wherein an inclined angle of a first slope of at least one of the openings at a central area of the opening column is different from inclined angles of first slopes of ones of the openings in outer areas of the opening column.

A separation distance between ones of the plurality of nozzles at a central area of the source portion may be greater than a separation distance between ones of the plurality of nozzles in outer areas of the source portion.

A length of the source portion along the first direction may be greater than a width of the mask for deposition along the first direction.

The source portion may be configured to move in the second direction crossing the first direction.

The mask for deposition may be configured to be combined with one side of the substrate so that the first and second slopes face the source portion.

The outer areas may include a first outer area and a second outer area, the central area may be between the first and second outer areas, and a first slope of each of ones of the openings at the first and second outer areas may be closer to the central area than a second slope of each of the ones of the openings at the first outer area.

Inclined angles of the first slopes at the first and second outer areas may be smaller than inclined angles of the second slopes at the first and second outer areas.

One of the inclined angles of the first slopes of ones of the openings in outermost areas of each of the first and second outer areas may follow $$\tan\theta 1 = \frac{2Lt}{Ls1 + Ls2}$$

wherein $\theta 1$ is an angle of the one of the inclined angles of the first slopes, $Lt$ is a distance between the source portion and the mask for deposition, $Ls1$ is a length of the source portion in the first direction, and $Ls2$ is a width of the mask for deposition in the first direction.

One of the inclined angles of the second slopes of the ones of the openings at the outermost areas of each of the first and second outer areas may follow $$\tan\theta 2 = \frac{2Lt}{Ls1 - Ls2}$$

wherein θ2 is an angle of the one of the inclined angles of the second slopes.

The inclined angles of the first slopes of the ones of the openings at the first and second outer areas that are closer to the central area may be greater than the inclined angles of the first slopes of others of the ones of the openings at the first and second outer areas that are farther from the central area The inclined angles of the second slopes of the ones of the openings at the first and second outer areas that are closer to the central area may be smaller than the inclined angles of the second slopes of the others of the ones of the openings at the first and second outer areas that are farther from the central area.

BRIEF DESCRIPTION OF THE FIGURES

Exemplary embodiments of the present invention will be described below in more detail with reference to the accompanying drawings. The embodiments of the present invention may, however, be embodied in different forms, and should not be constructed as limited to the embodiments set forth herein. Rather, the following embodiments are provided so that this disclosure will be thorough and complete, and will fully convey the scope of the present invention to those skilled in the art. Like reference numbers refer to like elements throughout.

FIG. 1 is a side view of when viewing a deposition apparatus in accordance with an embodiment of the present invention from one side.

FIG. 2 is a side view of when viewing a deposition apparatus in accordance with an embodiment of the present invention from a different side from that shown in FIG. 1.

DETAILED DESCRIPTION

Figure 3A:
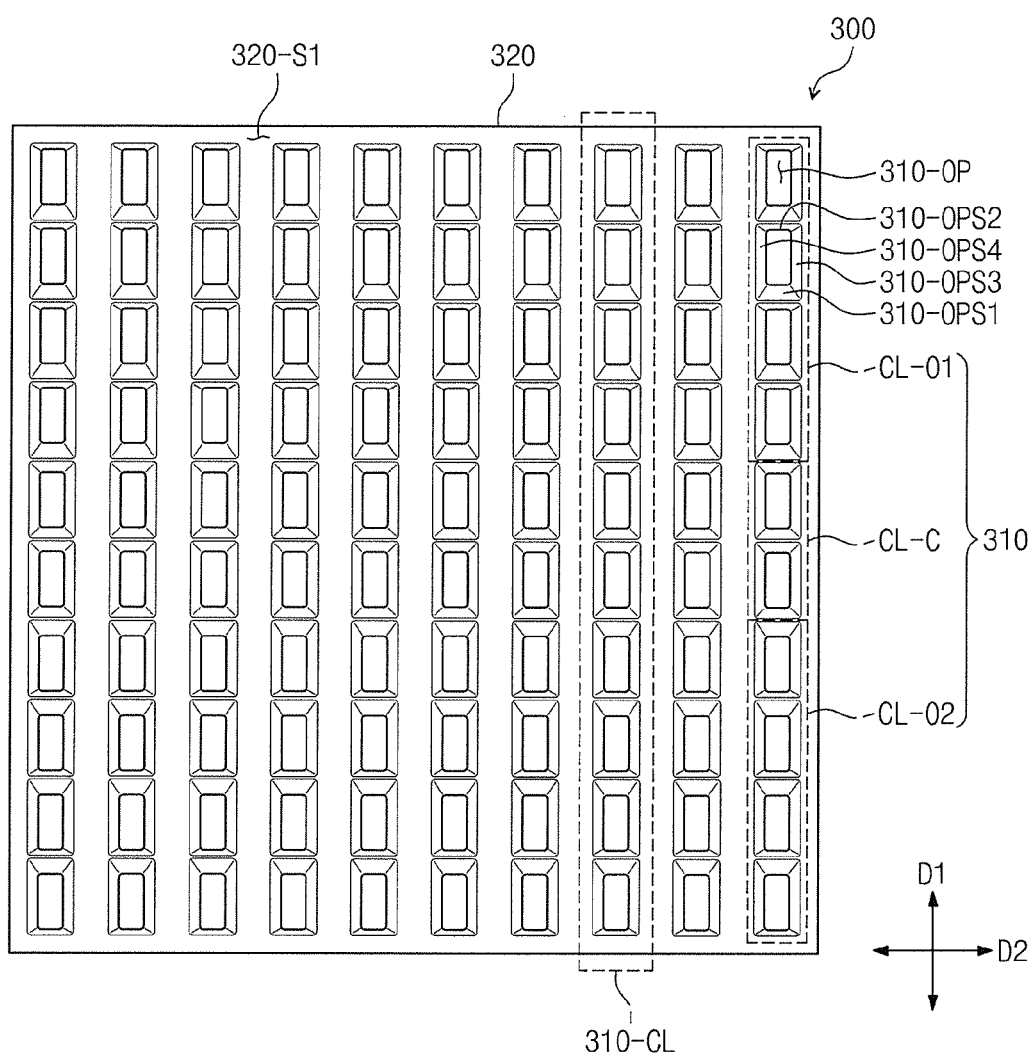
FIG. 3A is a top plan view illustrating one side of a mask of the embodiment illustrated in FIG. 1.

Embodiments of the present invention will be described more fully hereinafter with reference to the accompanying drawings, in which embodiments of the invention are shown. Embodiments of the present invention may, however, be embodied in many different forms, and the present invention should not be construed as limited to the embodiments set forth herein. Rather, these embodiments are provided so that this disclosure will be thorough and complete, and will fully convey the scope of the present invention to those skilled in the art. In the drawings, the size and relative sizes of layers and regions may be exaggerated for clarity. Like numbers refer to like elements throughout.

FIG. 1 is a side view of a deposition apparatus in accordance with an embodiment of the present invention from one side. FIG. 2 is a side view of a deposition apparatus in accordance with the embodiment of the present invention illustrated in FIG. 1 from another side.

As illustrated in FIGS. 1 and 2, a deposition apparatus 10 in accordance with an embodiment of the present invention includes a source portion 200 for providing deposition material DM to a substrate 100, and a mask 300 between the substrate 100 and the source portion 200.

The substrate 100 may be a planar member constituting a display, or may be a planar member constituting a semiconductor device. The substrate 100 may include, for example, glass, silicon, metal and plastic. Hereinafter, the substrate 100 is described as a planar member constituting a display.

The substrate 100 may include a plurality of pixel areas (not shown) and a non-pixel area (not shown) adjacent to the pixel areas. For instance, the pixel areas of an organic light-emitting display device may each include a pixel including an organic light-emitting layer. The pixel areas may be arranged in a matrix shape. The non-pixel area surrounds each of the pixel areas. The non-pixel area is an area in which a thin film transistor and a signal interconnection are formed.

The source portion 200 includes a plurality of nozzles 210 arranged in a first direction (D1). Each of the nozzles 210 discharges the deposition material DM. The deposition material DM may be an organic substance or an inorganic substance. The type of deposition material DM may be selected according to whether the substrate 100 constitutes a portion of display or a portion of semiconductor device. The kind of the deposition material DM may also be selected according to a step of manufacturing process. Deposition material DM deposited on the pixel area of the substrate 100 forms a thin film pattern.

The nozzles 210 may be arranged at regular intervals, or may be arranged at different intervals depending on an area. In FIGS. 1 and 2, the source portion 200 having nozzles 210 arranged at different intervals depending on an area is illustrated.

The source portion 200 has a greater length along the first direction D1 than a width of the mask 300 along the first direction D1, which will be described later. Thus, a part of the nozzles 210 may be located on the outside of the mask 300.

The mask 300 of the present embodiment includes a deposition material passing portion (310 of FIG. 3A) and a frame portion (320 of FIG. 3A) adjacent to the deposition material passing portion 310. The deposition material passing portion 310 includes at least one opening column (310-CL of FIG. 3A). If the mask 300 includes a plurality of opening columns 310-CL, the opening columns 310-CL may be arranged in regular intervals.

The deposition material DM that passed through openings 310-OP of the mask 300 is uniformly deposited on the pixel areas of the substrate 100.

The deposition process described above may proceed in a state that the mask 300 and the substrate 100 are combined with each other. The combined mask 300 and substrate 100 may move (e.g., may move with respect to the source portion 200) in a second direction D2 crossing the first direction D1, or the source portion 200 may move (e.g., may move with respect to the mask 300 and substrate 100) in the second direction D2.

In the present embodiment, the mask 300 and the substrate 100 are fixed, and the source portion 200 moves in the second direction D2. If the source portion 200 moves, damage of the substrate 100 that may occur due to its movement may be prevented.

The deposition apparatus 10 may further include a chamber (not shown) providing a space in which a deposition process is performed. The substrate 100, the source portion 200 and the mask 300 may be located inside the chamber. A vacuum pump (not shown) may be connected to the chamber so that the deposition process maintains a vacuum state.

Figure 3B:
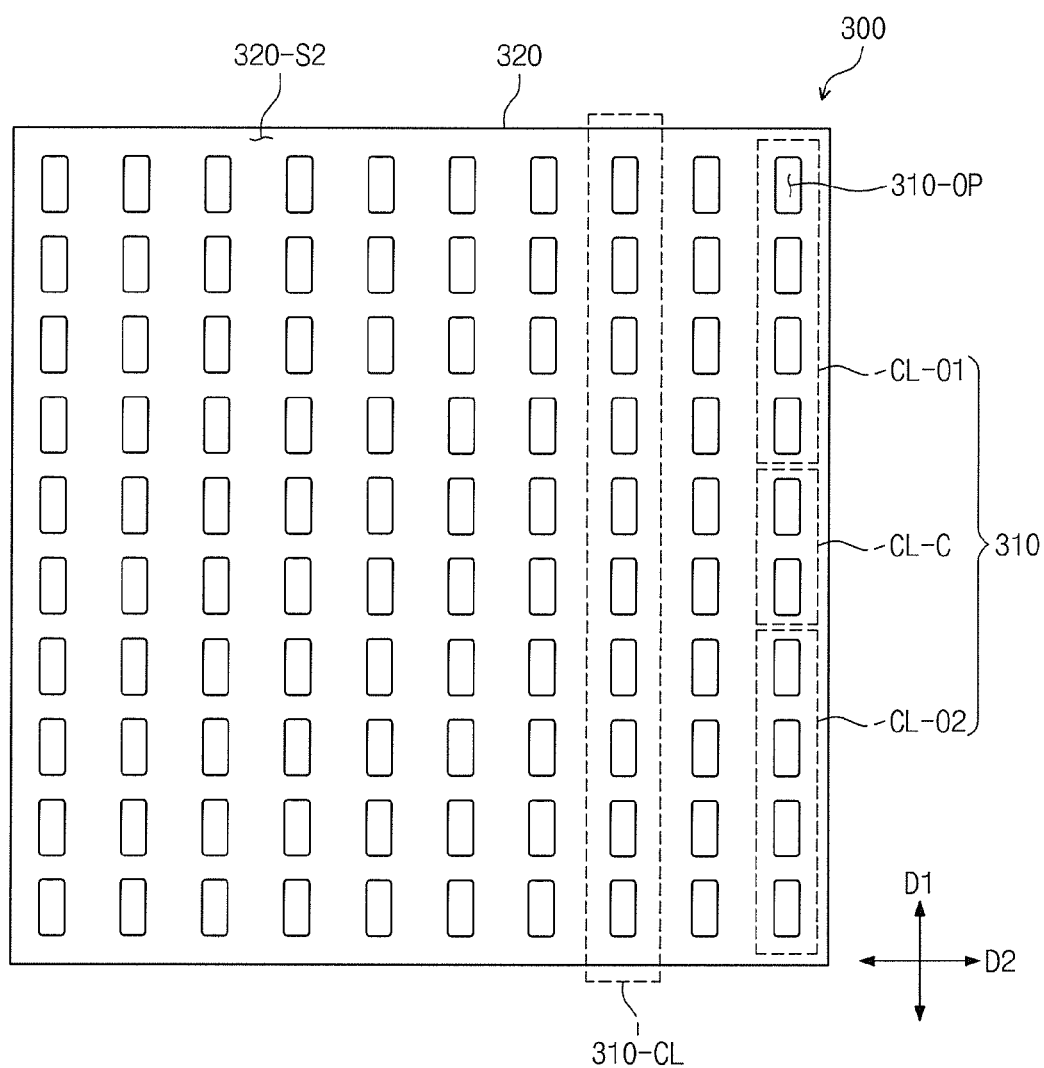
FIG. 3B is a top plan view illustrating the other side of the mask of the embodiment illustrated in FIG. 1.
Figure 4:
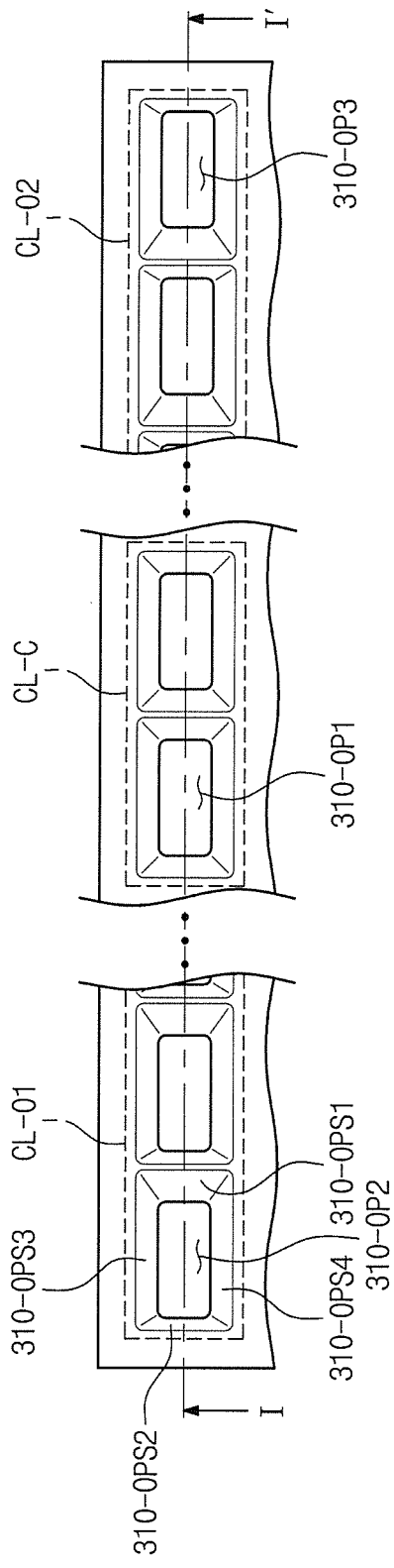
FIG. 4 is an enlarged view of a part of the mask of the embodiment FIG. 3A.
Figure 5:
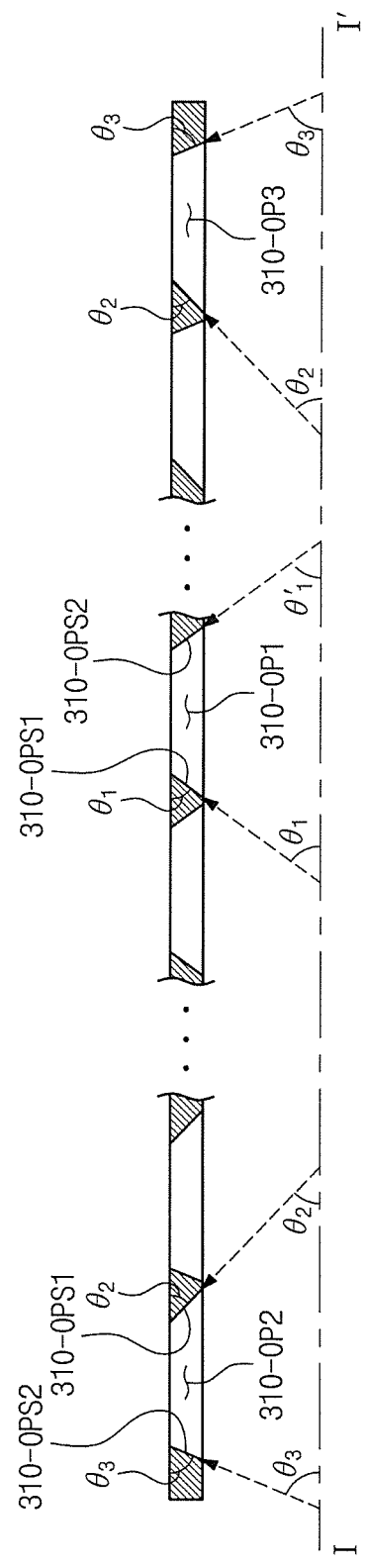
FIG. 5 is a cross sectional view taken along the line I-I' of FIG. 4.

FIG. 3A is a top plan view illustrating one side of a mask of the embodiment illustrated in FIG. 1. FIG. 3B is a top plan view illustrating the other side of the mask of the embodiment illustrated in FIG. 1. FIG. 4 is an enlarged view of a part of the mask of the embodiment illustrated in FIG. 3A. FIG. 5 is a cross sectional view taken along the line I-I' of FIG. 4. Hereinafter, the mask 300 will be described in detail with reference to FIG. 3A through 5.

The frame portion 320 of the present embodiment substantially forms a frame of the mask 300, provides one side 320-S1 and the other side 320-S2, and surrounds each of the openings 310-OP. FIG. 3A illustrates one side 320-S1 of the frame portion 320, and FIG. 3B illustrates the other side 320-S2 of the frame portion 320. When the mask 300 and the substrate 100 are combined with each other, the other side 320-S2 of the frame portion 320 is in contact with the substrate 100.

As illustrated in FIGS. 3A and 3B, the opening columns 310-CL are arranged in the second direction D2. Hereinafter, the present embodiment will be described with one opening column 310-CL as the center.

The openings 310-OP are arranged in the first direction D1. A separation distance between adjacent openings 310-OP may be uniform. In FIGS. 3A and 3B, the opening column 310-CL has ten openings 310-OP.

The opening 310-OP (e.g., the edges of the opening 310-OP) is defined by a first slope 310-OPS1 and a second slope 310-OPS2 facing each other along the first direction D1, and by a third slope 310-OPS3 and a fourth slope 310-OPS4 facing each other along the second direction D2.

The opening column 310-CL is categorized by a first outer area CL-O1 and a second outer area CL-O2 with a central area CL-C therebetween. At least one opening 310-OP is located in the central area CL-C, and a plurality of openings 310-OP is located in each of the first outer area CL-O1 and the second outer area CL-O2, respectively.

If the opening column 310-CL includes an odd number of openings 310-OP, an odd number (e.g., one) of the openings 310-OP may be located in the central area CL-C. If the openings 310-CL include an even number of openings 310-OP, an even number (e.g., two) of openings 310-OP may be located in the central area CL-C. The same number of openings 310-OP is located in the first outer area CL-O1 and the second outer area CL-O2.

The first slope 310-OPS1 and the second slope 310-OPS2 incline at an angle (e.g., a predetermined angle) toward the one side 320-S1 and the other side 320-S2 of the frame portion 320. That is, the first slope 310-OPS1 and the second slope 310-OPS2 incline from the one side 320-S1 to the other side 320-S2.

The first slope 310-OPS1 of each of the openings 310-OP located in the first outer area CL-O1 and the second outer area CL-O2 is arranged to be more adjacent to the central area CL-C as compared with the second slope 310-OPS2. For example, in FIG. 3A, the first slope 310-OPS1 of each of the openings 310-OP in the first outer area CL-O1 is at a bottom of the respective opening 310-OP in a direction D1, while the second slope 310-OPS2 of each of the openings 310-OP in the first outer area CL-O1 is at a top of the respective opening 310-OP in the direction D1. Also, the first slope 310-OPS1 of each of the openings 310-OP located in the second outer area CL-O2 is at a top of the respective opening 310-OP in the direction D1, while the second slope 310-OPS2 of each of the openings 310-OP in the second outer area CL-O2 is at a bottom of the respective opening 310-OP in the direction D1.

The first slope 310-OPS1 of the openings 310-OP in the central area CL-C has a different inclined angle from the first slope 310-OPS1 of the openings 310-OP in the first outer area CL-O1 or the second outer area CL-O2. Also, the second slope 310-OPS2 of the openings 310-OP in the central area CL-C has a different inclined angle from the second slope 310-OPS2 of the openings 310-OP in the first outer area CL-O1 or the second outer area CL-O2.

Herein, an inclined angle of the first slope 310-OPS1 is defined by an angle between the first slope 310-OPS1 and the other side 320-S2 of the frame portion 320. An inclined angle of the second slope 310-OPS2 is defined by an angle between the second slope 310-OPS2 and the other side 320-S2 of the frame portion 320.

The third slope 310-OPS3 and the fourth slope 310-OPS4 of the opening 310-OP may incline toward the one side 320-S1 and the other side 320-S2 of the frame portion 320 (e.g., the third slope 310-OPS3 and the fourth slope 310-OPS4 of the opening 310-OP may form a slope in the opening 310-OP from the one side 320-S1 to the other side 320-S2). At this time, an inclined angle of the third slope 310-OPS3 may be the same as an inclined angle of the fourth slope 310-OPS4.

FIGS. 4 and 5 are enlarged views of a first opening 310-OP1 in the central area CL-C, a second opening 310-OP2 in the first outer area CL-O1, and a third opening 310-OP3 in the second outer area CL-O2. The second opening 310-OP2 and the third opening 310-OP3 are located on an outer side (e.g., an area farthest from the central area CL-C) of the first outer area CL-O1 and the second area CL-O2, respectively.

As illustrated in FIG. 5, the first slope 310-OPS1 of the first opening 310-OP1 has a first inclined angle $\theta 1$. The second slope 310-OPS2 of the first opening 310-OP1 may have the same inclined angle as that of the first slope 310-OPS1 of the first opening 310-OP1. Since the first opening 310-OP1 is located in the central area CL-C of the opening column 310-CL, the amount of deposition material DM provided to the first slope 310-OPS1 and the second slope 310-OPS2 from the nozzles 210 of the source portion 200 is substantially identical.

The first slope 310-OPS1 of the second opening 310-OP2 has a second inclined angle $\theta 2$, and the second slope 310-OPS2 of the second opening 310-OP2 has a third inclined angle $\theta 3$. The first slope 310-OPS1 and the second slope 310-OPS2 of the third opening 310-OP3 have the second inclined angle $\theta 2$ and the third inclined angle $\theta 3$, respectively.

To deposit a uniform amount of deposition material DM on the pixel area of the substrate 100 corresponding to the openings 310-OP, regardless of the locations of the openings 310-OP in the opening column 310-CL, the second inclined angle $\theta 2$ is smaller than the first inclined angle $\theta 1$ and the third inclined angle $\theta 3$.

Figure 6:
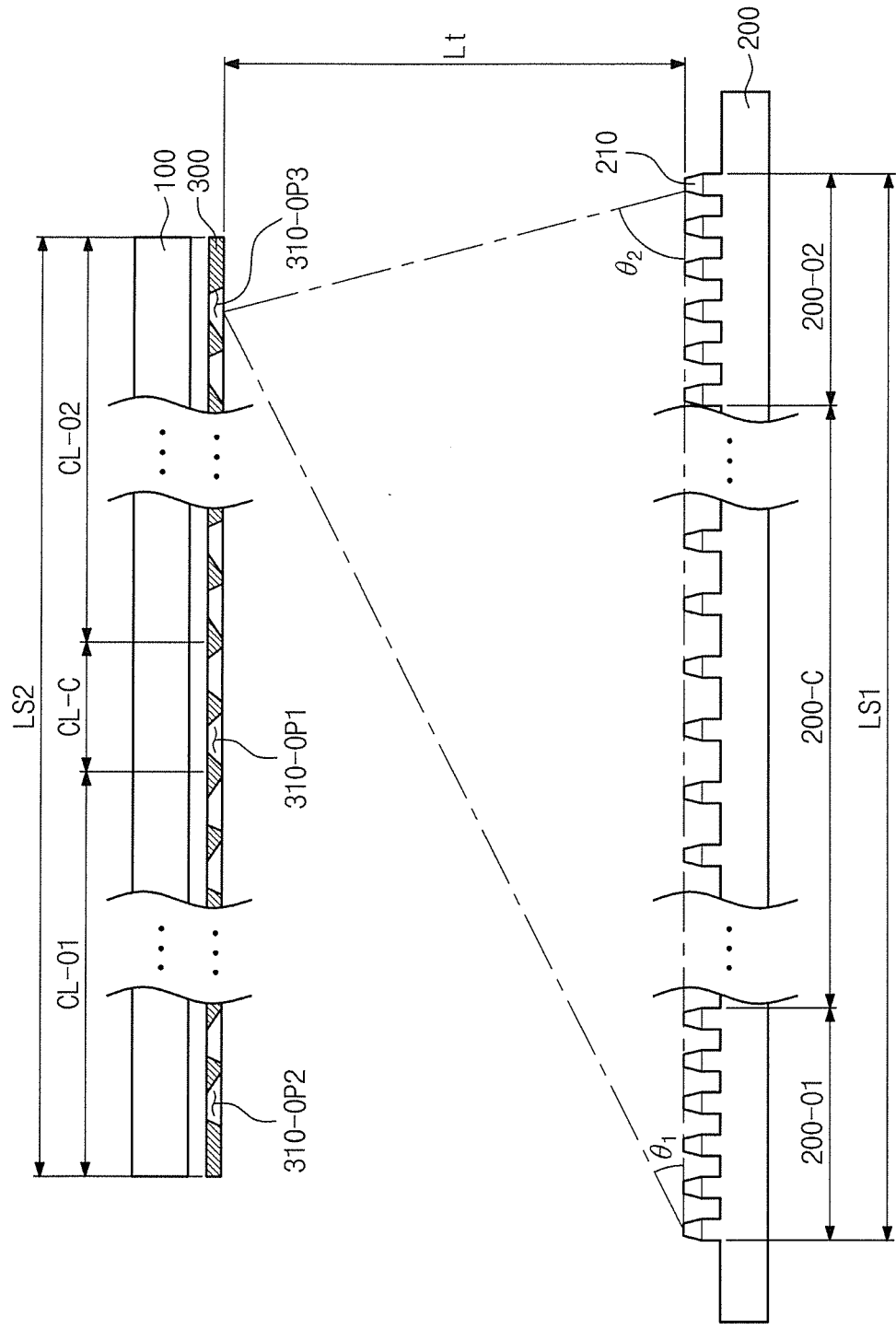
FIG. 6 is a view illustrating a range in which deposition material is provided to an opening of a mask illustrated in FIG. 5.

As illustrated in FIG. 6, the source portion 200 may be referred to as a central area 200-C between a first outer area 200-O1 and a second outer area 200-O2. The first outer area 200-O1 and the second outer area 200-O2 correspond to larger nozzle densities, as compared to the central area 200-C. That is, a separation distance of the nozzles 210 corresponding to the central area 200-C is greater than a separation distance of the nozzles 210 corresponding to the first outer area 200-O1 and the second outer area 200-O2.

The abovementioned disparity regarding nozzles 210 is to provide a sufficient amount of deposition material DM to pixel areas of the substrate 100 located near edges of the mask 300. The first and second outer areas 200-O1 and 200-O2 of the source portion 200 don't necessarily have to respectively correspond to the first and second outer areas CL-O1 and CL-O2.

To achieve the goal described above, it is desirable that a length LS1 of the source portion 200 in the first direction D1 is greater than a width LS2 of the mask 300. The length LS1 of the source portion 200 is a distance between the nozzles 210 located on both edges of the source portion 200 (e.g., a distance between outer edges of the nozzles 210 on both edges of the source portion 200). The nozzles 210 located on the outer sides of the mask 300 sufficiently provide the deposition material DM to pixel areas of the substrate 100 located near edges of the mask 300.

A range of the first, second and third inclined angles θ1, θ2 and θ3 is described in detail with reference to FIGS. 6 and 7.

The opening 310-OP located in the outermost area of the first outer area CL-O1 (i.e., the second inclined angle θ2 of the second opening 310-OP2) follows Mathematical Formula 1 below. The second inclined angle θ2 of the third opening 310-OP3 of the second outer area CL-O2 also follows Mathematical Formula 1.

$$\tan\theta 2 = \frac{2Lt}{Ls1 + Ls2}$$ Mathematical Formula 1

Lt is a distance (e.g., a vertical distance) between the source portion 200 and the mask 300, and more specifically, between an end of one of the nozzles 210 and the mask 300. Ls1 is a length of the source portion 200 (e.g., along the first direction D1), and Ls2 is a width of the mask 300 (e.g., along the first direction D1).

The third inclined angle θ3 of each of the second opening 310-OP2 and the third opening 310-OP3 follows Mathematical Formula 2.

$$\tan\theta 3 = \frac{2Lt}{Ls1 - Ls2}$$ Mathematical Formula 2

The first inclined angle θ1 of the first opening 310-OP1 is greater than the second inclined angle θ2 in Mathematical Formula 1, and is smaller than 90°.

Figure 7:
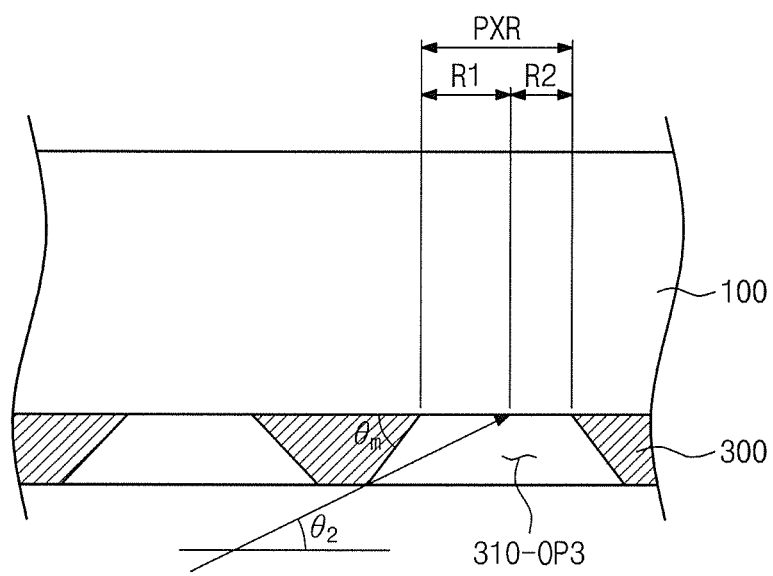
FIG. 7 is a view illustrating deposition material provided to any one of openings of the mask of the embodiment illustrated in FIG. 6.

As illustrated in FIG. 7, if the third opening 310-OP3 has a second inclined angle θ2 that is smaller than the angle in accordance with Mathematical Formula 1, a part of the deposition material DM provided to the third opening 310-OP3 is deposited on only a part of the pixel region PXR. For instance, the deposition material DM discharged from the nozzle 210 located in the outermost area of the first outer area 200-O1 is deposited on a second part R2 of the pixel region PXR, but is not deposited on a first part R1 of the pixel region PXR. Thus, uniformity of the thin film pattern is reduced.

To solve the problem, the second inclined angle θ2 of the third opening 310-OP3 is determined according to Mathematical Formula 1. Mathematical Formula 1 is a formula considering an angle at which the deposition material DM discharged from the nozzle 210 located in the outermost area of the first outer area 200-O1 enters the third opening 310-OP3.

If the openings 310-OP are located not only in the third opening 310-OP3, but also in the second outer area CL-O2, and have the second inclined angle θ2 in accordance with Mathematical Formula 1, a uniform (e.g., more uniform) thin film may be formed. This is due to the fact that openings 310-OP in the second outer area CL-O2 adjacent to the central area CL-C have a larger angle at which the deposition material DM enters the openings 310-OP when compared to openings 310-OP in the second outer area CL-O2 that are not adjacent to the central area CL-C.

As illustrated in FIG. 6, even though the third inclined angle θ3 is greater than the second inclined angle θ2, the third opening 310-OP3 may uniformly receive the deposition material DM discharged from the nozzle 210 located in the outermost area of the second outer area 200-O2.

If the third inclined angle θ3 follows Mathematical Formula 2, an interval between the openings 310-OP located on the opening column 310-CL remains constant. As the second inclined angle θ2 is reduced, an area of the first slope 310-OPS1 increases. However, since an area of the third slope 310-OPS3 is reduced as the third inclined angle θ3 increases, an interval between the openings 310-OP remains constant.

Each of the openings 310-OP located in the first and second outer areas CL-O1 and CL-O2 may each have the second inclined angle θ2 in accordance with Mathematical Formula 1, or may have different second inclined angles θ2. As the openings 310-OP located in the first and second outer areas CL-O1 and CL-O2 are located nearer the central area CL-C, the second inclined angle θ2 increases. The second inclined angle θ2 is equal to or less than the first inclined angle θ1.

Each of the openings 310-OP located in the first outer area CL-O1 may have the third inclined angle θ3 in accordance with Mathematical Formula 3, or may have different third inclined angles θ3. As the openings 310-OP located in the first outer area CL-O1 and the second outer area CL-O2 are located nearer the central area CL-C, the third inclined angle θ3 decreases. The third inclined angle θ3 is equal to or greater than the first inclined angle θ1.

The mask for deposition may form a uniform thin film on an area corresponding to the opening regardless of a location of the opening.

According to the deposition apparatus, openings located in an outer area of the opening column effectively receive the deposition material from the nozzles of the source portion. Thus, the openings located in the central area of the opening column and the openings located in the outer area of the opening column pass the substantially uniform amount of deposition material.

The above-disclosed subject matter is to be considered illustrative, and not restrictive, and the appended claims and their equivalents are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A mask for deposition comprising:
   a deposition material passing portion comprising at least one opening column having a plurality of openings arranged along a first direction; and
   a frame portion adjacent the deposition material passing portion and having a first side and an opposite second side, the first side facing a source portion configured to provide a deposition material to a substrate,
   wherein, each of the openings is defined by a first slope and a second slope facing each other along the first direction and inclining in a direction from the second side of the frame portion toward the first side of the frame portion, and a third slope and a fourth slope facing each other along a second direction crossing the first direction, wherein an inclined angle of the first slope of one of the openings at a central area of the at least one opening column is different from an inclined angle of the first slope of an other one of the openings at an outer area of the at least one opening column, and wherein the inclined angle of the first slope is different from an inclined angle of the second slope in at least some of the openings.

2. The mask for deposition of claim 1, wherein the outer area comprises a first outer area and a second outer area, and wherein the central area is between the first and second outer areas.

3. The mask for deposition of claim 2, wherein the first slope of each of the openings at the first and second outer areas is closer to the central area than the second slope thereof.

4. The mask for deposition of claim 3, wherein the inclined angles of the first slopes of the openings at the first and second outer areas are smaller than the inclined angles of the second slopes of the openings at the first and second outer areas.

5. The mask for deposition of claim 4, wherein the inclined angles of the first slopes of ones of the openings at the first and second outer areas that are closer to the central area are greater than the inclined angles of the first slopes of other ones of the openings at the first and second outer areas that are farther from the central area.

6. The mask for deposition of claim 5, wherein the inclined angles of the second slopes of the ones of the openings at the first and second outer areas that are closer to the central area are smaller than the inclined angles of the second slopes of the other ones of the openings at the first and second outer areas that are farther from the central area.

7. The mask for deposition of claim 1, wherein the inclined angle of the second slope of one of the openings at the central area is substantially the same as an inclined angle of the first slope of the one of the openings at the central area.

8. The mask for deposition of claim 1, wherein an inclined angle of the third slope is the same as an inclined angle of the fourth slope.

9. A deposition apparatus comprising:
a source portion comprising a plurality of nozzles arranged along a first direction and configured to provide a deposition material to a substrate; and
a mask for deposition between the substrate and the source portion, the mask for deposition comprising:
a deposition material passing portion comprising at least one opening column having a plurality of openings arranged along the first direction; and
a frame portion adjacent to the deposition material passing portion, the frame portion having a first side and an opposite second side, the first side facing the source portion,
wherein each of the openings is defined by first and second slopes facing each other in the first direction and inclined in a direction from the second side of the frame portion toward the first side of the frame portion, and by third and fourth slopes facing each other in a second direction, and
wherein an inclined angle of the first slope of at least one of the openings at a central area of the at least one opening column is different from inclined angles of the first slopes of ones of the openings at outer areas of the at least one opening column, and wherein the inclined angle of the first slope is different from an inclined angle of the second slope in at least some of the openings.

10. The deposition apparatus of claim 9, wherein a separation distance between ones of the plurality of nozzles at a central area of the source portion is greater than a separation distance between ones of the plurality of nozzles at outer areas of the source portion.

11. The deposition apparatus of claim 10, wherein a length of the source portion along the first direction is greater than a width of the mask for deposition along the first direction.

12. The deposition apparatus of claim 9, wherein the source portion is configured to move in the second direction crossing the first direction.

13. The deposition apparatus of claim 9, wherein the mask for deposition is configured to be combined with one side of the substrate so that the first and second slopes face the source portion.

14. The deposition apparatus of claim 9, wherein the outer areas comprise a first outer area and a second outer area,
wherein the central area is between the first and second outer areas, and
wherein the first slope of each of the ones of the openings at the first and second outer areas is closer to the central area than the second slope of each of the ones of the openings at the first and second outer areas.

15. The deposition apparatus of claim 14, wherein the inclined angles of the first slopes at the first and second outer areas are smaller than the inclined angles of the second slopes at the first and second outer areas.

16. The deposition apparatus of claim 15, wherein one of the inclined angles of the first slopes of ones of the openings at outermost areas of each of the first and second outer areas follows $$\tan\theta 1 = \frac{2Lt}{Ls1 + Ls2}$$

wherein:
$\theta 1$ is an angle of the one of the inclined angles of the first slopes;
Lt is a distance between the source portion and the mask for deposition;
Ls1 is a length of the source portion in the first direction; and
Ls2 is a width of the mask for deposition in the first direction.

17. The deposition apparatus of claim 16, wherein one of the inclined angles of the second slopes of the ones of the openings at the outermost areas of each of the first and second outer areas follows $$\tan\theta 2 = \frac{2Lt}{Ls1 - Ls2}$$

wherein $\theta 2$ is an angle of the one of the inclined angles of the second slopes.

18. The deposition apparatus of claim 15, wherein the inclined angles of the first slopes of ones of the openings at the first and second outer areas that are closer to the central area are greater than the inclined angles of the first slopes of other ones of the openings at the first and second outer areas that are farther from the central area.

19. The deposition apparatus of claim 18, wherein the inclined angles of the second slopes of the ones of the openings at the first and second outer areas that are closer to the central area are smaller than the inclined angles of the second slopes of the other ones of the openings at the first and second outer areas that are farther from the central area.

* * * * *